United States Patent [19]

Testin et al.

[11] Patent Number: 4,897,718
[45] Date of Patent: Jan. 30, 1990

[54] RAPID ACCESS REMOTE CONTROL SYSTEM

[75] Inventors: William J. Testin; Roger L. Richards, both of Indianapolis, Ind.

[73] Assignee: Thomson Consumer Electronics, Inc., Indianapolis, Ind.

[21] Appl. No.: 183,505

[22] Filed: May 3, 1988

[51] Int. Cl.$^4$ ............................................. H04N 5/44
[52] U.S. Cl. ............................... 358/194.1; 358/188; 455/151; 341/24; 340/825.69
[58] Field of Search ............... 358/194.1, 188, 183, 358/13; 455/151, 353; 341/24; 340/825.69, 825.72

[56] References Cited

U.S. PATENT DOCUMENTS 4,386,436  5/1983  Kocher et al. ................. 358/194.1
4,622,481  11/1986 Nortrup ............................ 307/522
4,769,643  9/1988  Sogame ......................... 358/194.1

OTHER PUBLICATIONS

Publication, "CTC 140 Color TV Chassis Technical Training Manual", pp. 1 and 21-33, Copyright 1987, by General Electric Company.

Primary Examiner—John K. Peng
Attorney, Agent, or Firm—Joseph S. Tripoli; Peter M. Emanuel

[57] ABSTRACT

A remote control system for a television receiver includes provisions for delaying a predetermined time duration before responding to a new remote control comman after a previous remote control command to prevent undesired toggling of toggle control functions (e.g., power application and muting) due to momentary interruptions of remote control transmissions which may occur when a user unintentionally points the transmitter away from the television receiver. It also includes provisions for sampling the envelope of the remote control transmission to determine if an interruption corresponds to an intended termination of transmission to provide rapid repeated response (i.e., "machine-gunning") to commands such as "channel up" or "channel down".

9 Claims, 4 Drawing Sheets

RAPID ACCESS REMOTE CONTROL SYSTEM

The present invention concerns a remote control system.

Remote control systems are widely employed to control video and audio consumer electronic equipment. The speed at which such equipment can respond is important to users, especially for certain functions. For example, many television receivers and video cassette recorders have provisions for "stepping" from one channel to another when a user presses a "channel up" or a "channel down" key. In present remote control systems, the stepping speed is limited by several factors.

In many remote control systems a minimum pause is provided before a new channel can be selected so that a user has sufficient time to determine what the program for a presently selected channel is. A typical pause is about 0.5 seconds long. That means it takes about 5 seconds to step through 10 channels.

In an improved remote control system, a new channel is immediately caused to be tuned if the user presses, releases and again presses either the "channel up" or "channel down" key. This type of rapid access operation has come to be known by some as "machine-gunning" or "shot-gunning". However, even in this type of improved remote control system, the access time for selecting a new channel is limited by a so-called "debounce" operation normally utilized to minimize control errors.

"Debouncing" is a term of art originally used with respect to keyboard switch decoding. After a key of a keyboard is pressed, a "debounce time, corresponding to the time required for the associated switch contacts to settle, is allowed to elapse before the key contact closures are decoded to minimize decoding errors. In remote control systems, a debouncing operation is also conventionally provided to minimize control errors that may otherwise occur due to unintended momentary interruptions of the reception of a remote control message.

An interruption of the reception of a remote control message may occur even though a user continues to press the corresponding key when the user momentarily points the remote control transmitter away from the television receiver and toward the ceiling or floor, for example. An interruption can be interpeted as a key release and the resumption of the remote control message (when the user points the remote control transmitter back to the television receiver) can be interpreted as another key press for the same remote control command. In the case of "toggle" type control functions (i.e., functions such as power control and audio muting which are switched "on" and "off" when a single key corresponding to the function is pressed, released and pressed again), such unintended interruptions of a remote control message may cause an undesired toggling between the two states of the function.

Allowing a debounce time to elapse before a new remote control command is executed after the execution of a previous remote control command prevents the undesired toggling of toggle functions due to unintended momentary interruptions of a remote control message. Unfortunately, debouncing also limits the speed at which an intended new remote control command can be responded to.

The present invention is directed to a remote control system which has a debouncing operation for preventing undesired toggling of toggle functions in response to unintended interruptions of a remote control message but nevertheless allows for very rapid response (shorter than the debounce time) to a key press-release-press sequence for such functions as channel stepping.

Specifically in accordance with the present invention, a remote control decoder, which provides for a debounce time delay before a new remote control command is executed after a previous remote control command has been executed, is also responsive to a detector for detecting the absence of a remote control message for allowing the new remote control command to be executed before the termination of the debounce time delay. The detector may take the form of an envelope detector for detecting the envelope of a modulated carrier comprising the remote control message. Sampling the envelope a predetermined number of times, with a given number of samples having an amplitude below a given level, indicates the absence of the envelope and thereby an intended end of a previous remote control transmission.

These and other features of the present invention will be described with reference to the accompanying Drawing in which.

Figure 1:
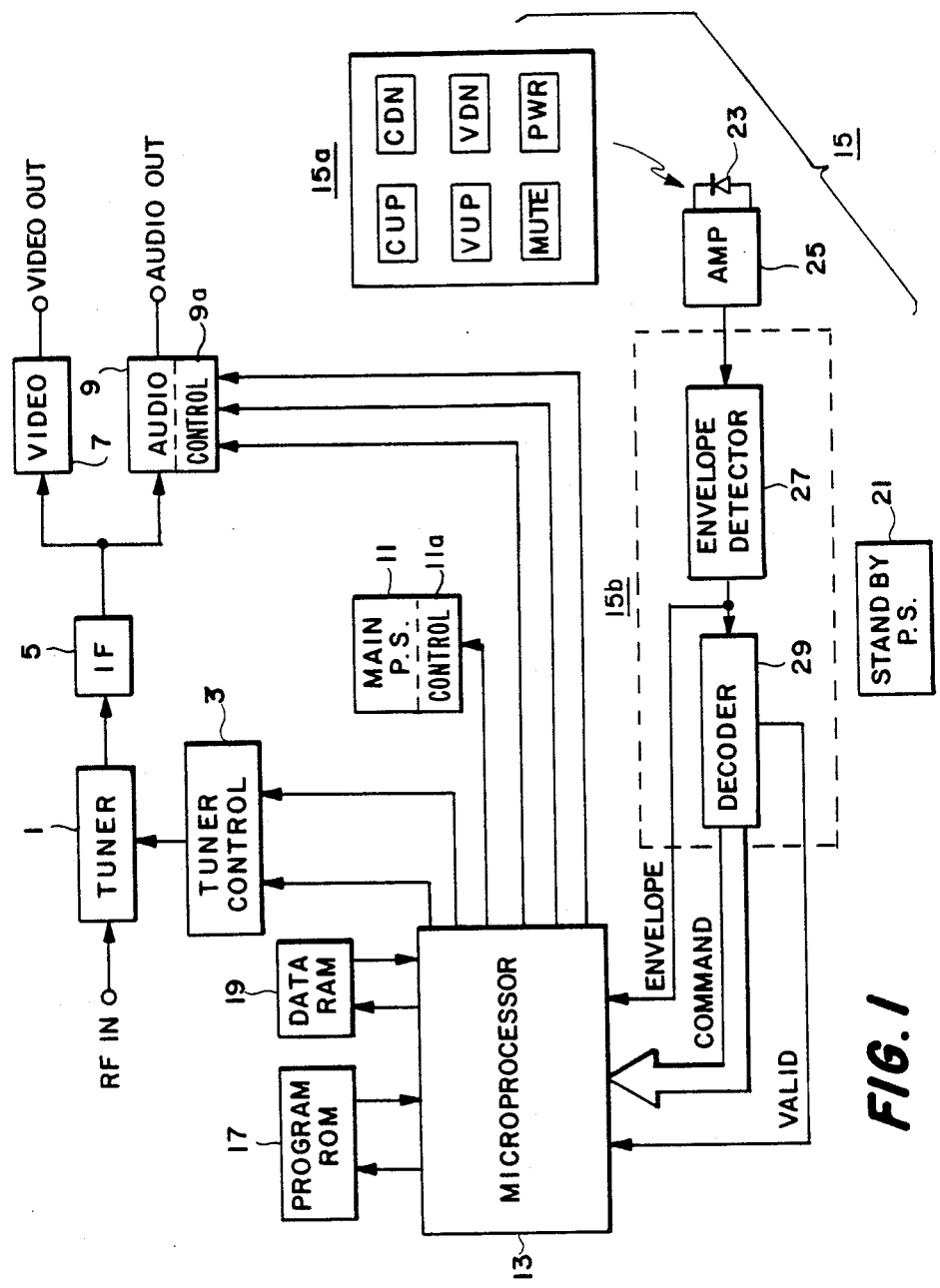
FIG. 1 shows a block diagram of a television receiver with a remote control system embodying certain features of the present invention.

The television receiver shown in FIG. 1 includes a tuner 1 for tuning one of the RF signals received at an RF input corresponding to a selected channel to produce an IF signal under the control of a tuner control unit 3. The IF signal is filtered, amplified and otherwise processed in an IF section 5 before being coupled to a video processing unit 7 and an audio processing unit 9. In video processing unit 7 and audio processing unit 9, respective components of the IF are demodulated and processed to produce video and audio output signals. A main power supply 11 provides operating power to the portions of the television receiver described so far when the receiver is turned "on".

A microprocessor (or microcomputer) 13 generates control signals for various portions of the television receiver in response to a user initiated commands entered by means of a remote control system 15 (including a transmitter 15a and a receiver 15b), with which the invention is concerned, or by means of a control panel (not shown) mounted on the receiver itself. Microprocessor 13 operates in response to instructions of a program stored in a ROM (read only memory) 17. A RAM 19 is provided to store data processed by microprocessor 13. A "standby" power supply 21 supplies operating power to microprocessor 13 and remote control receiver section 15b of remote control system 15 even when the television receiver is turned "off" (i.e., main power supply 11 is not providing operating power) so that a remote control command for turning the receiver "on" can be processed.

The control signals generated by microprocessor 13 include: a power on/off control signal coupled to a control unit 11a of main power supply 11 for turning the television receiver on and off; "channel up" (CUP) and "channel down" (CDN) control signals coupled to tuner control unit 3 for causing the next higher and lower channels to be selected for tuning; "volume up" (VUP) and "volume down" (VDN) control signals coupled to audio processing unit 9 for increasing and decreasing the volume level; and a mute control signal coupled to a control unit 9a of audio processing unit 9 for selectively muting and un-muting the audio response.

The power on/off and muting control signals corresponds to toggle functions. That is, as these signals are repetitively generated, the respective functions toggle between two states (i.e., power "on" and power "off" and mute "on" and mute "off"). As the channel down, volume up and volume down functions are repetitively generated, the respective properties are changed by increments (i.e., one channel and one volume step). In the case of the channel up and down control signals, each time one of these channel change control signals is generated, the tuning process is interrupted and the tuning voltage for the next channel is caused to be generated by tuner control unit 3. For example, if tuner control unit 3 comprises a phase locked loop, the latter is accomplished by causing the division factor of the programmable divider of the phase locked loop to be changed.

Remote control transmitter 15a includes pushbutton switch keys corresponding to each of the control signals identified above. When a key of remote control transmitter 15a is pressed, the respective switch is activated (e.g., closed), and when the key is released, the respective switch automatically returns to the inactive (e.g., opened) state. As long as a key is pressed, a corresponding remote control message is generated. The remote control message comprises a carrier modulated with a pulse signal encooded to represent the function of the key. In this embodiment, the remote transmission medium is infra-red (IR).

As will be described below in greater detail with respect to FIG. 4, the encoded pulse signal has a predetermined format, a predetermined time duration and repeats as long as the key is pressed. Each period of the encoded pulse signal corresponds to the command associated with the pressed key. Thus, as long as the key is pressed, a series of commands is continuously transmitted.

The IR remote control message is received by remote control receiver 15b. Remote control receiver 15b and microprocessor 13 cooperate to decode the received remote control message to produce the control signals identified above.

Remote control receiver 15b includes a transducer 23 (e.g., a light responsive diode) and a preamplifier 25 for converting the received IR signal to a corresponding electrical signal. The electrical signal is coupled to an envelope detector 27 which produces an envelope signal corresponding to the encoded pulse signal of the remote control message. The envelope signal is coupled to a decoder 29 which decodes the pulse signal to produce a binary word which if valid, i.e., conforms to the predetermined transmission format, represents the command corresponding to the key of remote control transmitter 15a pressed by the user. Decoder 29 also generates a "valid" signal indicating when the assembled binary word corresponds to a valid command. Further details of decoder 29 will be described below with respect to FIG. 5. The envelope signal, the binary command word and the "valid" signal are coupled to microprocessor 13.

It should be noted here that while the control signals discussed above, and the various output signals of decoder 29 are indicated as being coupled to and from microprocessor 13 in parallel form, for sake of explanation, desirably they are coupled in serial form through a serial data bus.

As earlier noted, microprocessor 13, under program control, generates the control signal corresponding to the command decoded by decoder 29. The program includes provisions for a "debounce" time delay to be established after the detection of each valid command so that momentary interruptions (or dropouts) due to the user temporarily pointing remote control transmitter away from the television receiver will be ignored. If the debounce time delay were not provided, the interruptions could be interpreted to correspond to a key press-release-press sequence which could cause toggle functions such as power and mute to undesirably toggle.

Figure 2:
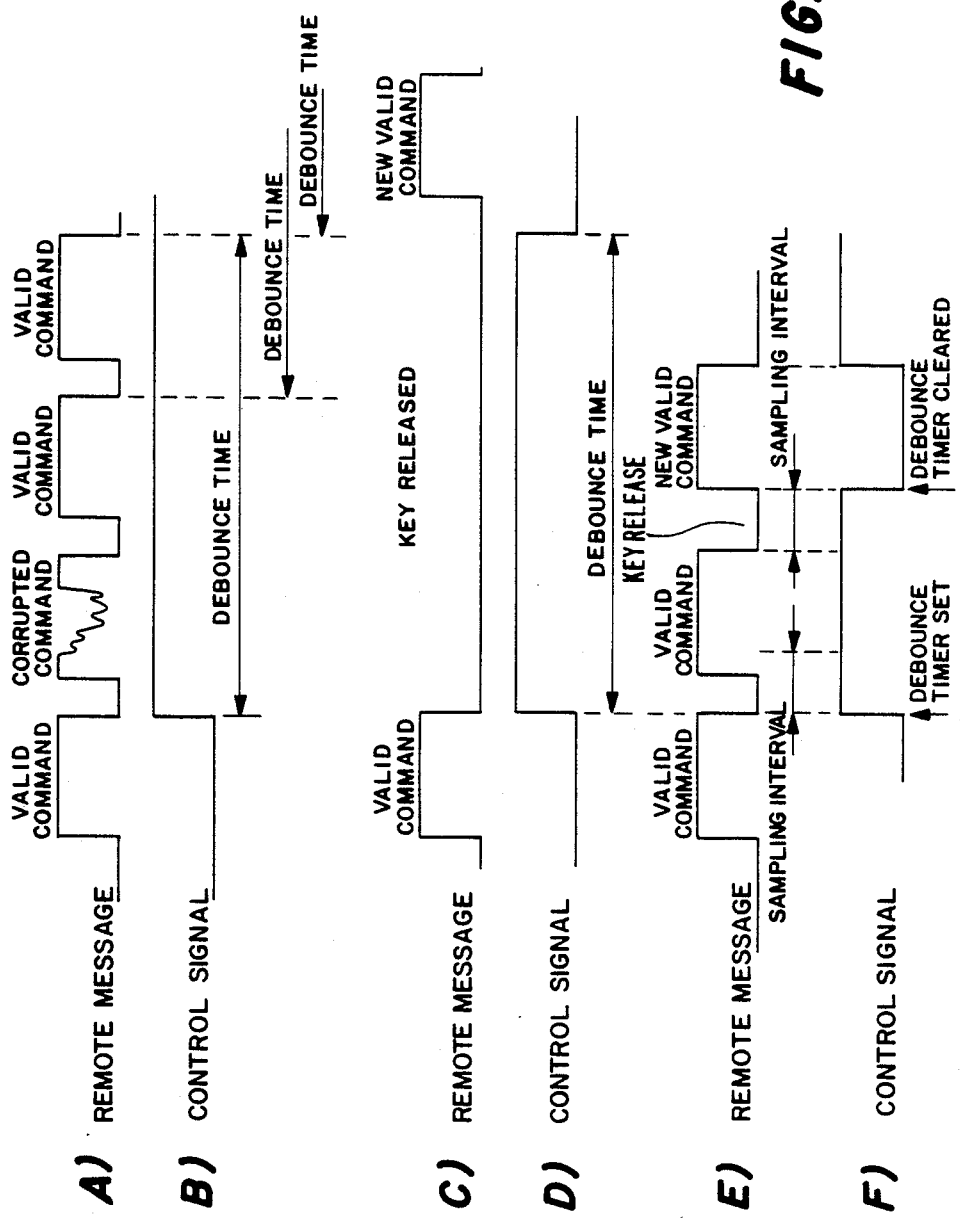
FIG. 2 shows simplified waveforms representing remote control messages under certain conditions which are useful in understanding the operation of the remote control system to be described with reference to FIG. 1.

The debouncing operation is depicted by waveforms A and B of FIG. 2. Waveform A depicts a remote control message comprising a sequence of commands of a predetermined duration (e.g., 56 milliseconds) separated by space intervals (e.g., 8 milliseconds). One of the commands is corrupted or degraded due to the user temporarily directing remote control transmitter 15a away from the television receiver. Waveform B indicates that the control signal generated in response to the last valid command (before the corrupted command) cannot change until after the debounce time has elapsed so that the corrupted command is ignored. It also indicates that each time a valid command is received, the debounce time is reestablished. As shown, in the present embodiment, the debounce time is set equal to the duration of three commands plus the spaces between them.

A problem with the debouncing operation, without the provisions of the present invention to be described below, is indicated by waveforms C and D of FIG. 2. Waveform C indicates an intentional interruption due to a key release. Waveform D indicates that the control signal generated in response to a valid command does not terminate, and therefore a "new" valid command cannot be responded to, until after the debounce time delay has elapsed. Accordingly, the speed at which the remote control system can respond to the repeated "new" generation of a control signal such as "channel up" and "channel down" for rapidly stepping from one channel to the next is limited by the debounce time delay.

To overcome the problem created by the debouncing operation, in the present remote control system after the detection of a valid command by decoder 25, the envelope signal generated by envelope detector 25 is sampled a predetermined number of times (e.g., 10) over a predetermined time interval (e.g., 10 milliseconds) longer then the space interval (e.g., 8 milliseconds) between successive commands but much shorter than the debounce time delay. If the envelope signal is present, although corrupted or degraded (due to the user misdirecting remote control transmitter 15a away from the television receiver), the amplitude of one or more samples will correspond to a continuous (although corrupted) transmission and the debounce operation will be initiated. In the present embodiment, the occurrence of more than 2 "high" level samples indicates the presence of the envelope signal and therefore a continuous transmission. However, if the envelope signal is absent, due to an intentional key release, none of the samples should correspond to the presence of the envelope signal. In the present embodiment less than 3 high samples indicates the absence of the envelope signal. If the envelope signal is absent (due to a key release), the next valid command is recognized as being a new command and a new control signal is generated. Waveforms E and F of FIG. 2 depict the operation of the present remote control system in the latter case.

Thus, the present remote control system has provisions for distinguishing between corrupted commands due to the user momentarily misdirecting remote control transmitter 15a and absent commands due to a key release in order to provide immunity from undesired toggling but nevertheless provide for rapid response.

Figure 3:
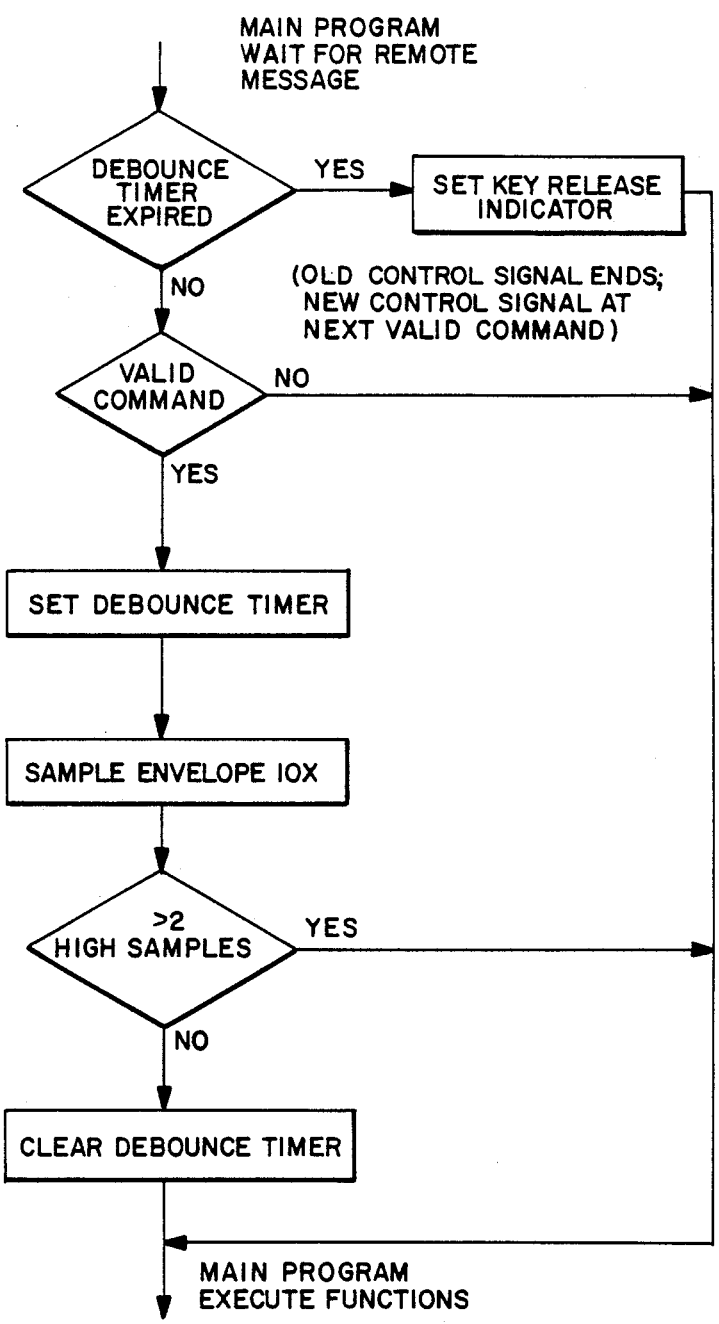
FIG. 3 shows a flow chart of a portion of a program for controlling a microprocessor included in the remote control system shown in FIG. 1 in accordance with the present invention.

FIG. 3 shows the flow chart of the portion of the decoding subroutine concerned with the debouncing operation and the improvement for increased rapid response utilizing envelope detection, with which the present invention is particularly directed. For the most part, the flow chart is self-explanatory considering the above explanation of operation. However, it is noted that the manner in which a key release and a subsequent new key press is permitted to be recognized is by clearing the debounce timer if less than 3 "high" envelope samples are detected (see also FIG. 2—waveform F). In this way, the debounce time operation is "bypassed" when there has been a key release—setting up the condition for rapid response.

Figure 4:
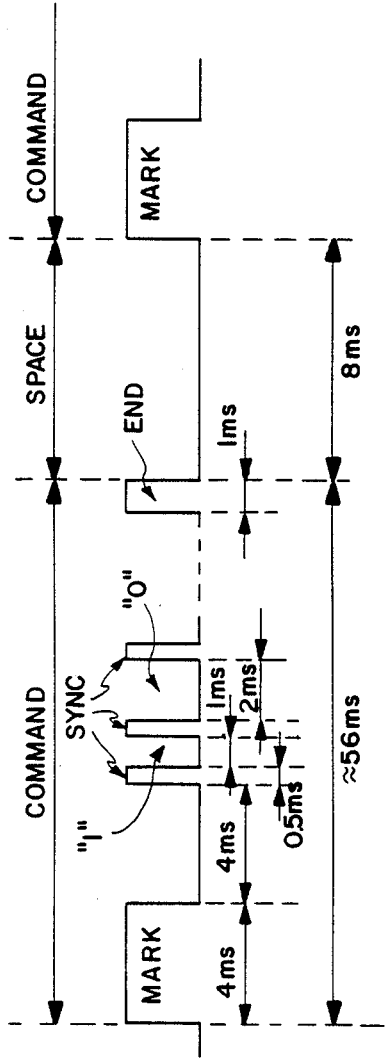
FIG. 4 shows a waveform helpful in understanding an exemplary encoding format which may be employed in the remote control system of FIG. 1.

FIG. 4 indicates, by way of example, a suitable format of the encoded pulse signal for modulating a carrier (e.g., at 56.875 KHz) to produce the transmitted remote control messages. As noted above, the messages comprise a sequence of identical commands corresponding to the pressed key separated by space intervals. The commands are about 56 milliseconds in duration and the space intervals are 8 milliseconds in duration. The commands include positive going pulses which correspond to a first amplitude modulation level of the carrier (e.g., "carrier present") and spaces corresponding to a second amplitude modulation level of the carrier (e.g., "carrier absent"). Each message includes a 4 millisecond mark pulse followed by a 4 millisecond space. Each data bit of the message is identified by a 0.5 millisecond "sync" pulse. The duration of the spaces after a "sync" pulse determines whether the data bit is a logic "1" or a logic "0". A 1 millisecond duration space identifies a logic "1" and a 2 millisecond space identifies a logic "0". Each command has 24 data bits including 12 data bits identifying the device (e.g., TV or VCR) to be controlled and the function (e.g., one of the functions identified above) followed by the complements of 12 data bits. A 1 millisecond "end" pulse identifies the end of a command.

Figure 5:
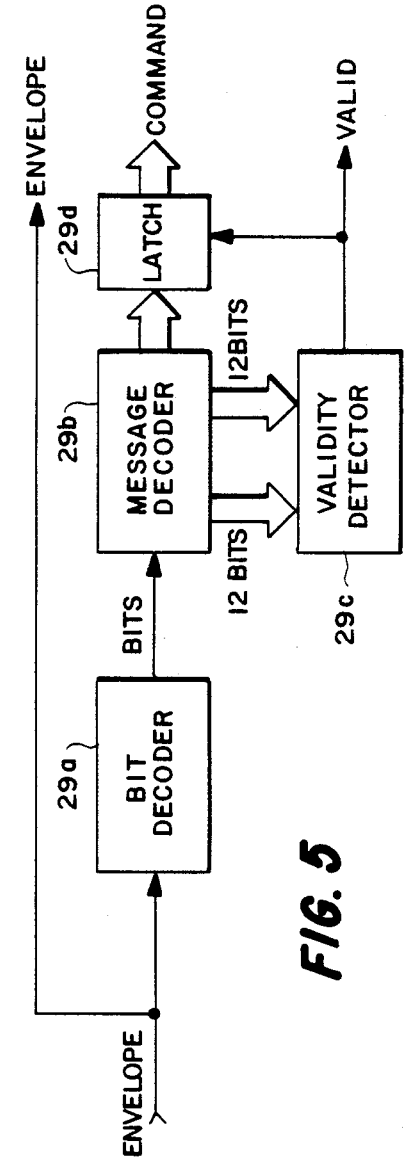
FIG. 5 shows a block diagram of a remote control decoder which may be utilized in the remote control system shown in FIG. 1, especially if the encoding format shown in FIG. 4 is utilized.

FIG. 5 shows decoder 29, described with reference to FIG. 1, in more detail. Decoder 29 includes a bit decoder 29a including a clocked counter and combination logic for determining the durations of the various pulses and spaces of the envelope signal to produce a sequence of logic "1's" and 0's" corresponding to the data of the commands of the remote control message. A message decoder 29b includes a shift register for storing the first 12 bits of data. After the first 12 bits of data are stored, the second 12 bits of data are compared to the first 12 bits in a validity detector 29c. In a valid command, the second 12 bits are the logical complements of the first 12 bits. If a valid command has been received, the 12 bits of the command are stored in a latch 29d ready for microprocessor 13 to decode into the control signal.

The AIU (analog interface unit) integrated circuit, available as RCA part number 1421874-2, employed in RCA brand name television receivers of the CTC-140 chassis type includes an envelope detector and a decoder suitable for use as envelope detector 27 and decoder 29 as shown and described. U.S. Pat. No. 4,622,481 entitled "Digital Envelope Detection Circuit", issued in the name of K. E. Nortrup et on Nov. 11, 1986 describes the envelope detector of the AIU integrated circuit in detail. Other portions of the disclosed television receiver may also be constructed in a manner similar to a corresponding part of the RCA CTC-140 receiver.

We claim:

1. In a remote control system for controlling a device in response to a remote control message including a carrier modulated with an encoded pulse signal and transmitted by a remote control transmitter, said encoded pulse signal conforming to a predetermined encoding format and having a predetermined time duration, apparatus comprising:

envelope detector means for deriving an envelope signal corresponding to said encoded pulse signal in response to said remote control message;

decoder means responsive to said envelope signal for generating a control signal corresponding to said remote control message when said envelope signal conforms to said predetermined encoding format and thereafter responsive to each of the end of a delay period longer than said predetermined duration of said encoded pulse signal and the absence of said envelope signal for a time interval shorter than said predetermined time duration for terminating said control signal; and function control means responsive to said control signal for performing a predetermined function of said device each time said control signal is generated.

2. The apparatus recited in claim 1, wherein:
said delay period is a multiple of said predetermined time duration of said encoded pulse signal.

3. The apparatus recited in claim 1, wherein:
said decoder means samples said envelope signal a predetermined number of times during said time interval and examines the amplitude of each sample to determine whether or not said envelope signal is absent.

4. The apparatus recited in claim 1, wherein:
said decoder means terminates said delay period in response to the absence of said envelope signal.

5. The apparatus recited in claim 1, wherein:
said decoder means comprises a computer operating in response to instructions of a stored program.

6. In a remote control system for controlling a television receiver in response to a control message selectively corresponding to a first change command or a second change command, said remote control message including a carrier modulated with an encoded pulse signal having a predetermined encoding format and having a predetermined time duration, apparatus comprising:

first processing means for performing a first function of said television receiver;

first control means responsive to a first change control signal for causing said first processing means to change between first and second states each time said first change control signal is generated;

second processing means for performing a second function of said television receiver;

second control means responsive to a second change control signal for causing said second processing means to change an operating condition by an increment each time said second change control signal is generated;

envelope detector means for deriving an envelope signal corresponding to said encoded pulse signal in response to said remote control message; and decoder means responsive to said envelope signal for generating said first change control signal each time said envelope signal conforms to said predetermined encoding format and corresponds to said first change command and thereafter responsive to each of the end of a delay period longer than said predetermined time duration of said encoded pulse signal and the absence of said envelope signal for terminating said first change control signal; and responsive to said envelope signal for generating said second change control signal each time said envelope signal conforms to said predetermined encoding format and corresponds to said second change command and thereafter responsive to each of the end of said delay period and the absence of said envelope signal for terminating said second change control signal.

7. The apparatus recited in claim 6, wherein:

said second processing means comprises tuner means for tuning television channels; and said second control means comprises tuner control means responsive to said second change control signal for causing said tuner to tune successive channels in response to successive generations of said second change control signal.

8. The apparatus recited in claim 7, wherein:

said first processing means comprises power supply means for supplying operating power to said television receiver; and said first control means comprises power supply control means responsive to said first change control signal for causing said power supply to alternately supply and not supply operating power to said receiver in response to successive generations of said first change control signal.

9. The apparatus recited in claim 7, wherein:

said first processing means comprises audio processing means for controlling the audio response of said television receiver; and said first control means comprises audio control means responsive to said first change signal for causing said audio processing means to alternately mute and not mute said audio response in response to successive generations of said first control signal.

* * * * *